United States Patent
Huang (10) Patent No.: US 7,965,525 B2
(45) Date of Patent: Jun. 21, 2011

(54) PWM DC STEADY-STATE OUTPUT CIRCUIT

(75) Inventor: Po-Sheng Huang, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 333 days.

(21) Appl. No.: 12/276,929

(22) Filed: Nov. 24, 2008

(65) Prior Publication Data

US 2010/0127797 A1 May 27, 2010

(51) Int. Cl.
*H02J 1/02* (2006.01)
*H02M 1/12* (2006.01)

(52) U.S. Cl. .............. 363/39; 363/41; 363/46

(58) Field of Classification Search ............. 363/39–48
See application file for complete search history.

(56) References Cited

U.S. PATENT DOCUMENTS

| 7,038,408 | B2 | 5/2006 | Lin et al. |
| 7,218,073 | B2 | 5/2007 | Huang et al. |
| 7,221,858 | B2 | 5/2007 | Ku |
| 7,839,662 | B2 * | 11/2010 | Powers et al. ............. 363/21.12 |
| 2007/0262764 | A1 * | 11/2007 | Warita et al. ................ 323/284 |

* cited by examiner

*Primary Examiner* — Jessica Han (57) ABSTRACT

In a pulse-width-modulation (PWM) direct current (DC) steady-state output circuit, there are included an electrode switch and a resistor-capacitor (RC) integrating filter. The electronic switch has a signal input end, via which a PWM signal is input, and a high-level end. The RC integrating filter includes at least one RC filtering unit and a first protection unit. There can be (1+n) order(s) of the RC filtering unit(s) with a first-order RC filtering unit connected to the electronic switch and the first protection unit and the RC filtering unit(s) at the rest order(s), if any, being sequentially connected to the first-order RC filtering unit one by one. When the electronic switch has signals input thereto, the RC integrating filter makes feedback compensation to enable output of a steady-state DC level.

13 Claims, 9 Drawing Sheets

PWM DC STEADY-STATE OUTPUT CIRCUIT

FIELD OF THE INVENTION

The present invention relates to a direct current (DC) steady-state output circuit, and more particularly to a pulse-width-modulation (PWM) DC steady-state output circuit.

BACKGROUND OF THE INVENTION

While the current electronic elements and products have been designed to meet the requirements for multifunction, high operating speed, high operating power and miniaturized volume, the high-density electronic elements in the electronic products with high operating power tend to produce more high-temperature heat during operation thereof. Therefore, heat dissipating mechanisms must be used to timely dissipate the produced heat for the circuits in the electronic products to maintain normal operation. Among others, the cooling fan is one of the most widely employed heat dissipating mechanisms. Airflows produced by the cooling fan enable increased heat exchange rate to achieve the effect of quick heat dissipation.

Generally, for the purpose of controlling the cooling fan to rotate at a stable speed, a pulse-width-modulation (PWM) to direct current (DC) voltage circuit is used for such control.

Figure 1A:
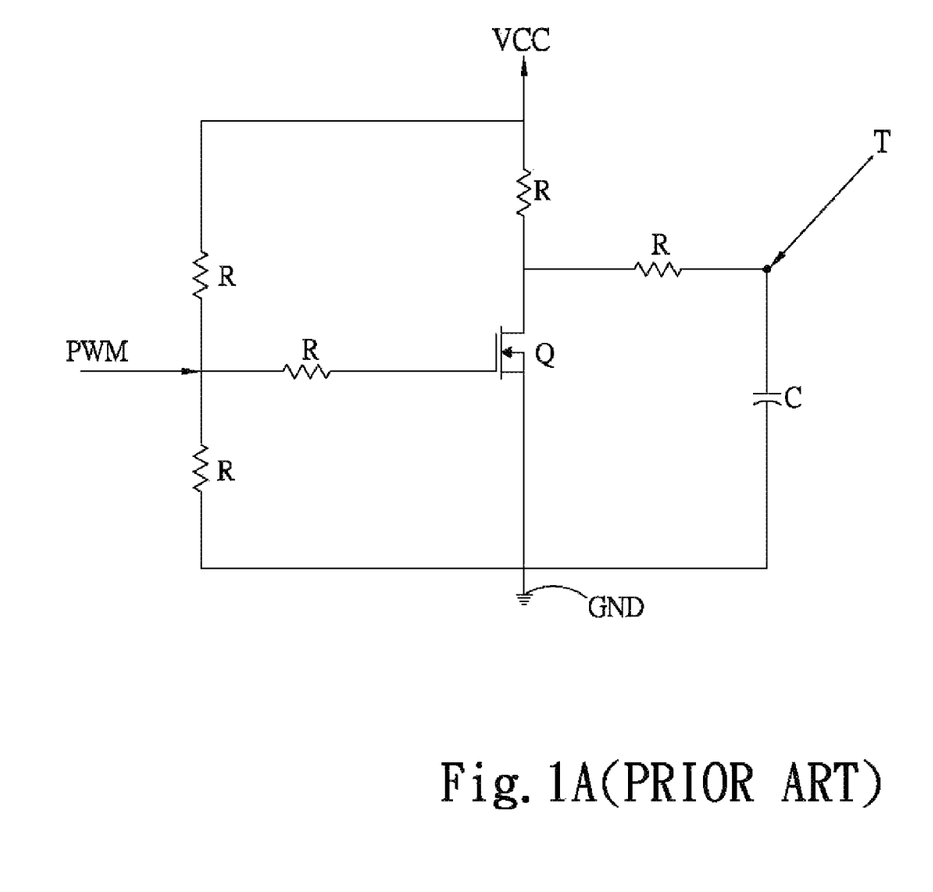
Figure 1B:
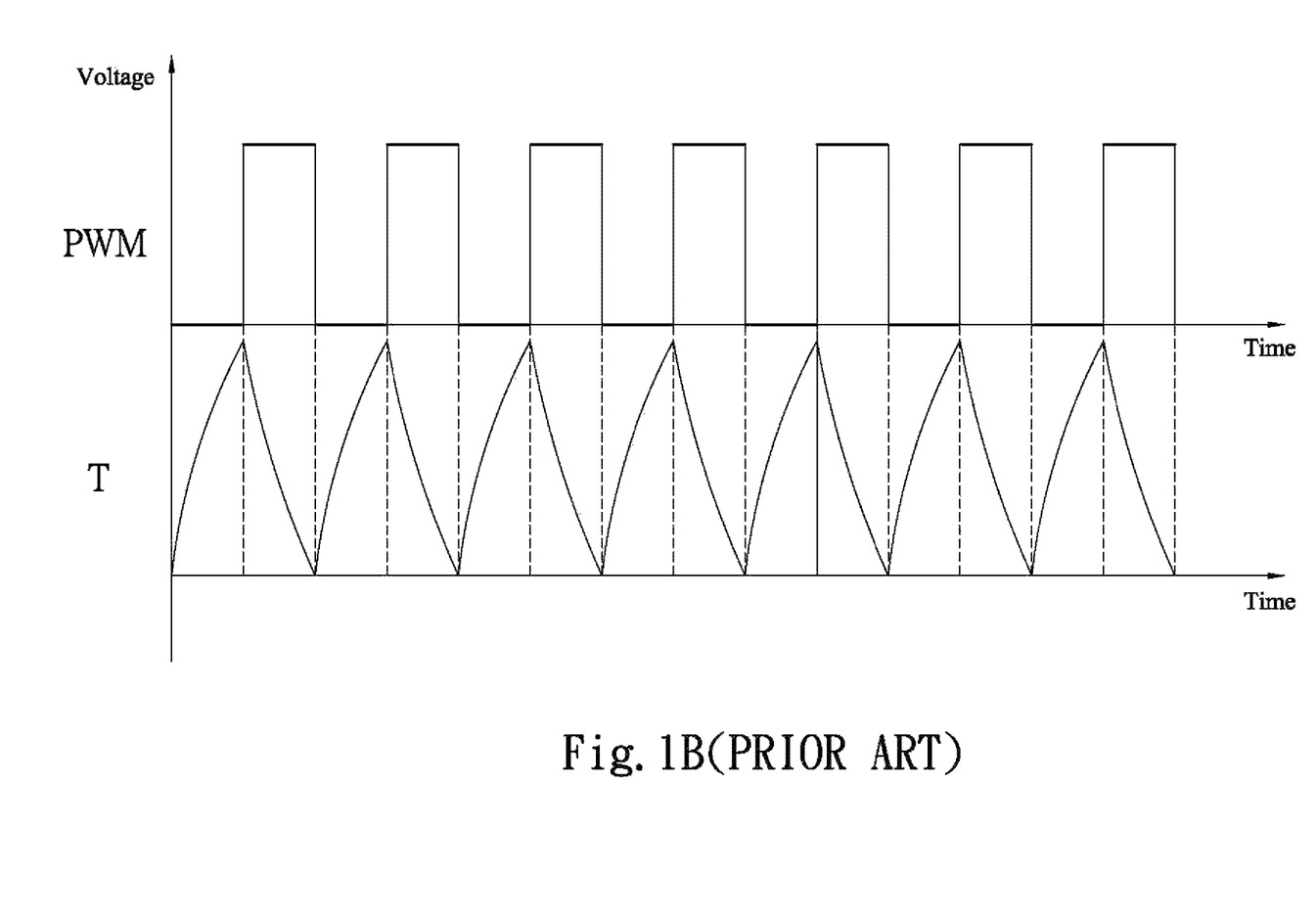
FIG. 1B shows PWM and T waveforms of the conventional PWM to DC voltage circuit.

Please refer to FIGS. 1A and 1B. A conventional PWM to DC voltage circuit is generally a single-order electronic switch resistor-capacitor (RC) integrating circuit, which consists of a transistor Q, a capacitor C, and five resistors R. When the state of an input PWM signal is OFF, that is, the PWM signal is "low" or zero (0), the PWM signal would not be able to trigger the transistor Q. At this point, the transistor Q is OFF, and electric current from a reference power supply VCC flows through the resistors R to the capacitor C until the capacitor C is fully charged and becomes saturated, as indicated by the waveform T in FIG. 1B.

When the state of the input PWM signal is ON, that is, the PWM signal is "high" or one (1), the transistor Q is immediately triggered by the PWM signal. At this point, the transistor Q is ON, allowing the electric current from the reference power supply VCC to quickly flow to a ground GND and be consumed. Meanwhile, voltage stored in the capacitor C is quickly discharged until electric charges at two ends of the capacitor C are completely discharged, as indicated by the waveform T in FIG. 1B.

Therefore, when the RC integrating circuit is controlled to charge or discharge through triggering of the transistor Q by the PWM signal, a DC level can be output to a control unit (not shown), such as a fan driving integrated circuit (IC), or a fan micro control unit (MCU), so that the control unit determines the fan rotating speed output based on the received DC level and controls the fan operation.

When the transistor Q is triggered by an input PWM signal having a relatively high frequency, such as 100 KHz, to control the RC integrating circuit to charge and discharge, the obtained DC level output can be in a steady state without apparent fluctuation. However, when the transistor Q is triggered by an input PWM signal having a relatively low frequency, such as lower than 100 Hz, to control the RC integrating circuit to charge and discharge, the obtained DC level output has relatively apparent fluctuation. Therefore, when trying to acquire the DC level to determine the fan rotating speed, the control unit would not be able to accurately acquire the DC level due to the relatively large fluctuation in the DC level. As a result, the fan rotating speed output is floating and unstable.

In brief, the conventional PWM to DC voltage circuit has the following disadvantages:
1. The single-order RC integrating circuit has fixed charge and discharge path, which could not be effectively regulated.
2. In the case of a low-frequency PWM signal input, the control unit fails to accurately acquire the DC level, resulting in unstable fan rotating speed output.

It is therefore tried by the inventor to develop an improved PWM DC steady-state output circuit to overcome the drawbacks in the conventional PWM to DC voltage circuit.

SUMMARY OF THE INVENTION

A primary object of the present invention is to provide a PWM DC steady-state output circuit, which includes an RC integrating filter for making feedback compensation to signals input to an electronic switch, so that a steady-state DC level can be output.

To achieve the above and other objects, the PWM DC steady-state output circuit according to the present invention includes an electronic switch having a signal input end and a high-level end, and a PWM signal is input via the signal input end; and an RC integrating filter having at least one RC filtering unit and a first protection unit. There can be (1+n) order(s) of the RC filtering unit(s). A first-order RC filtering unit is connected to the electronic switch and the first protection unit, and the rest n orders of RC filtering units are selectively connected to the first-order RC filtering unit. And, the rest n orders of RC filtering units are sequentially connected to a preceding order of RC filtering unit one by one. When the electronic switch has signals input thereto, the RC filtering unit at each of the orders makes feedback compensation to a level of an RC filtering unit at a preceding order, so that a steady-state DC level can be output.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein FIG. 1A schematically shows a conventional PWM to DC voltage circuit.

DETAILED DESCRIPTION OF THE PREFERRED EMBODIMENTS

Figure 2:
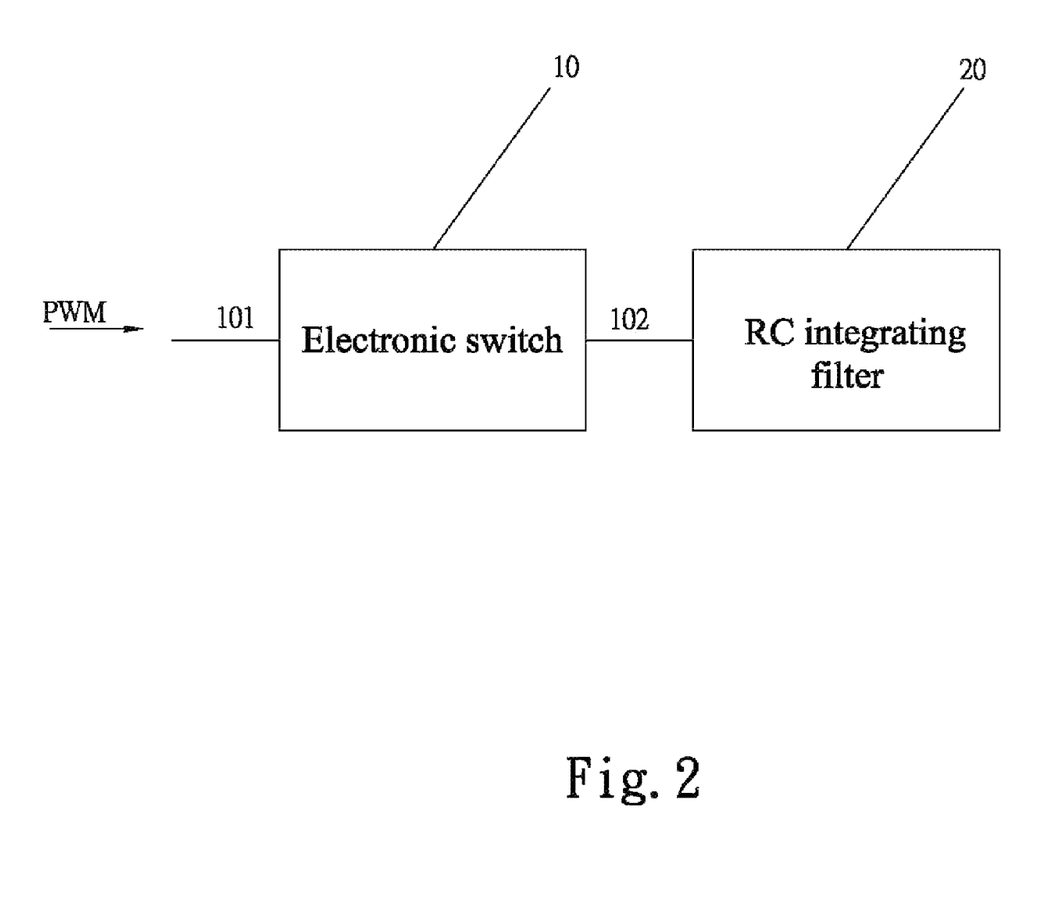
FIG. 2 is a block diagram of a PWM DC steady-state output circuit according to a preferred embodiment of the present invention.
Figure 3:
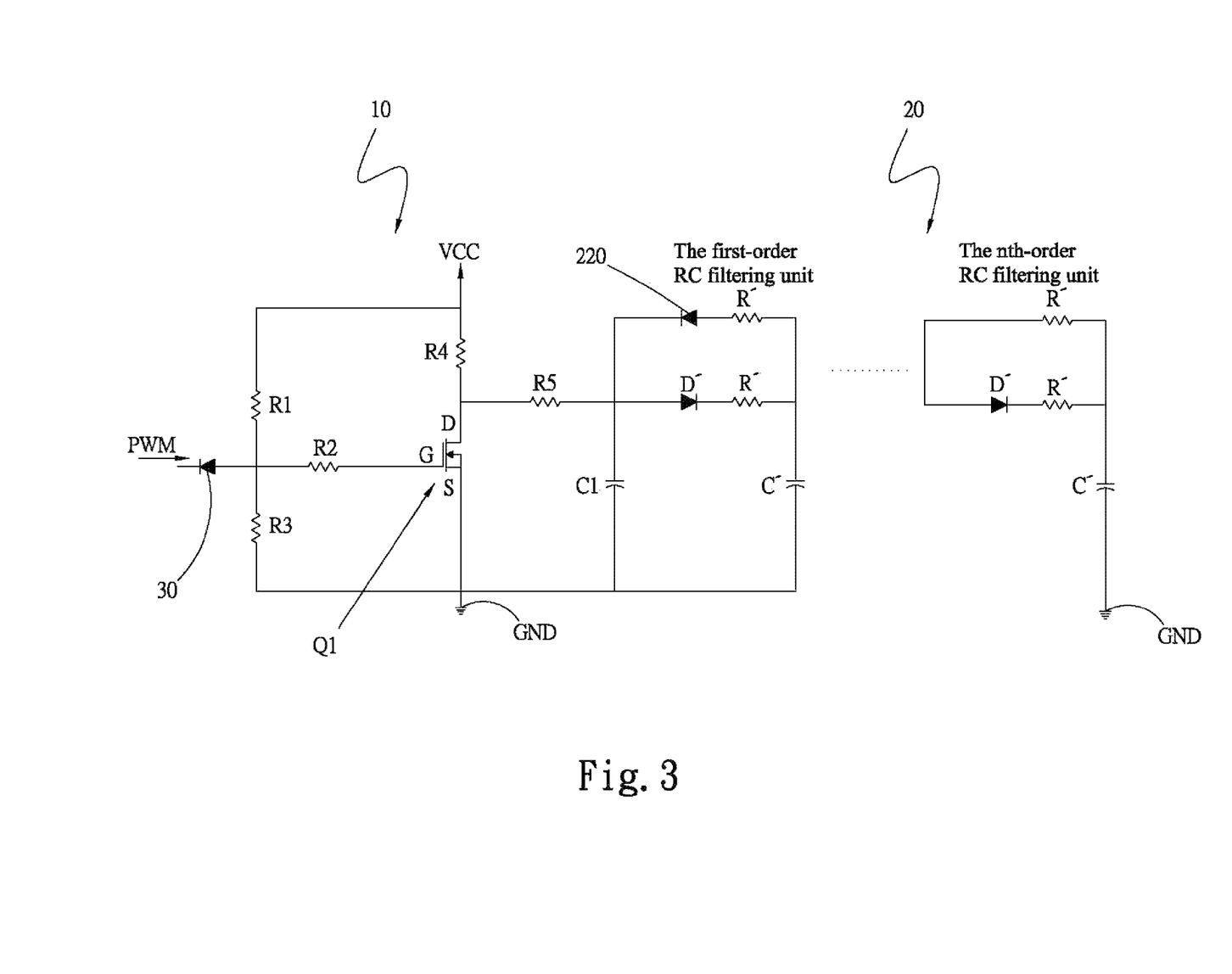
FIG. 3 is a circuit diagram of the PWM DC steady-state output circuit according to the preferred embodiment of the present invention.
Figure 4:
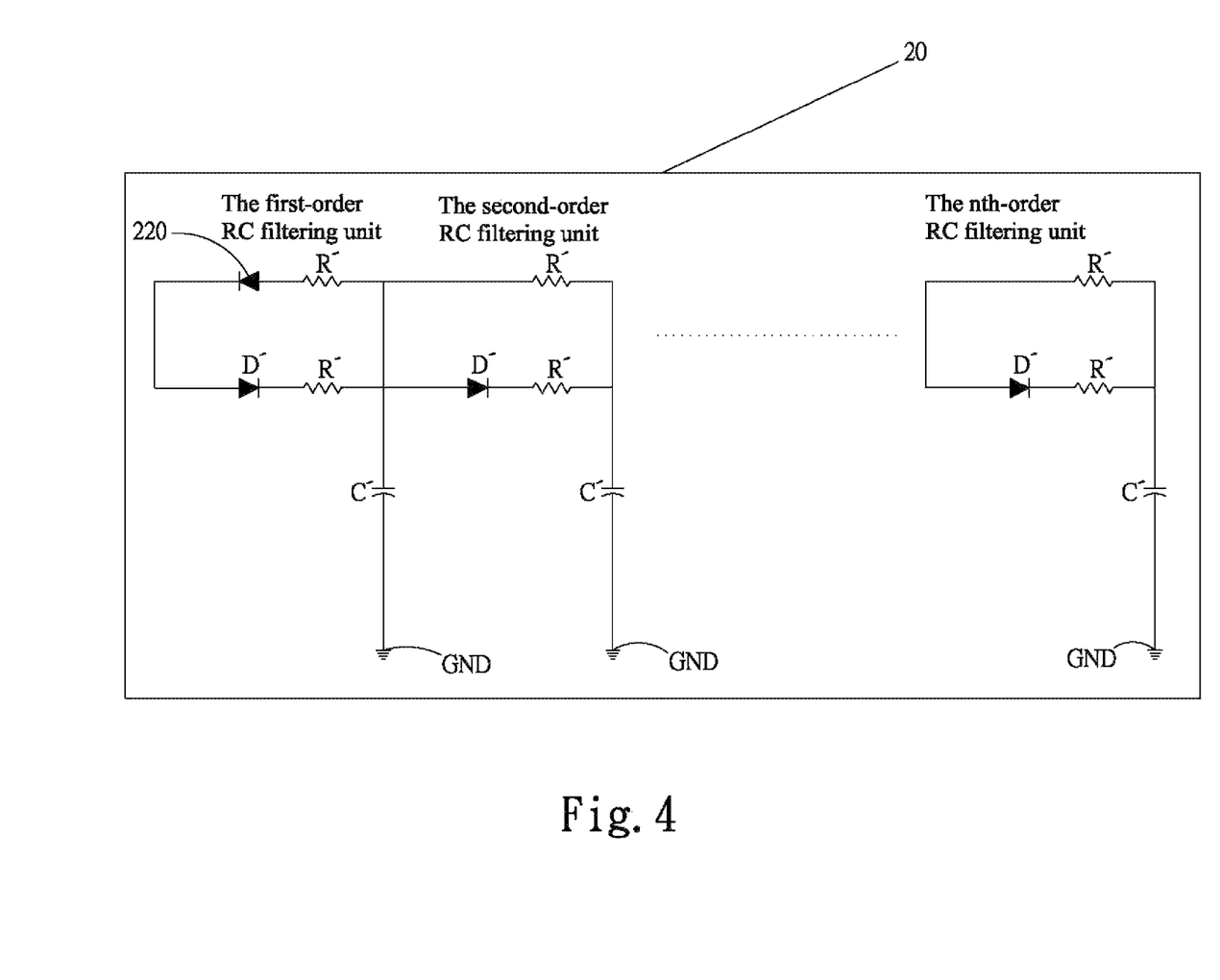
FIG. 4 is a circuit diagram of an RC integrating filter for the present invention.

Please refer to FIGS. 2, 3, and 4. In a PWM DC steady-state output circuit according to a preferred embodiment of the present invention, there are included an electronic switch 10 and an RC integrating filter 20. The electronic switch 10 has a signal input end 101, via which a PWM signal is input, and a high-level end 102, which is a reference power supply for supplying a voltage source.

The RC integrating filter 20 includes at least one RC filtering unit and a first protection unit 220. The first protection unit 220 is a diode adapted to prevent reverse current and voltage. There can be (1+n) order(s) of RC filtering unit(s). A first-order RC filtering unit is connected to the electronic switch 10 and the first protection unit 220, and the rest n orders of RC filtering units are selectively connected to the first-order RC filtering unit. Meanwhile, the rest n orders of RC filtering units are sequentially connected to a preceding order of RC filtering unit one by one. Where, n can be zero or any positive integer.

In other words, when n=2, there are 3 orders of RC filtering units. In this case, a first-order RC filtering unit is connected to the electronic switch 10 and the first protection unit 220, a second-order RC filtering unit is connected to the first-order RC filtering unit, and a third-order RC filtering unit is connected to the second-order RC filtering unit. In implementing the present invention, the value of n can be higher or lower depending on actual circuit requirement.

When the electronic switch 10 has signals input thereto, the RC filtering unit at each of the orders makes feedback compensation to the level of an RC filtering unit at a preceding order, so that a steady-state DC level is output. Therefore, according to actual circuit requirements, the number of orders of the RC filtering units can be increased or decreased to enable output of a steady-state DC level, making the circuit of the present invention highly flexible.

Alternatively, in the present invention, at least a first-order RC filtering unit is provided, and then, additional orders of RC filtering units can be selectively connected thereto. In the case additional orders of RC filtering units are to be connected to the first-order RC filtering unit, the RC filtering unit at each of the additional orders is connected to a preceding order of RC filtering unit one by one. Whether the first-order RC filtering unit is to be connected to additional orders of RC filtering units or not is determined according to actual need and the connection shall be completed during the manufacturing process in plant.

The structure of the present invention will now be described in more details with reference to FIGS. 3 and 4.

Signals input to the electronic switch 10 include the PWM signal and the voltage source from the reference power supply VCC. The RC filtering unit at each of the (1+n) orders consists of a sixth and a seventh resistor element R', a capacitor element C', and a diode element D'. The diode element D' has an anode connected to a first end of the sixth resistor element R', and a cathode coupled to a first end of the seventh resistor element R'. The seventh resistor element R' is connected at a second end to a second end of the sixth resistor element R' and a first end of the capacitor element C'. Then, the capacitor C' is electrically connected at a second end to a ground GND.

While the first-order RC filtering unit has a structure and element connection generally similar to that of the RC filtering units at other orders, the sixth resistor element R' of the first-order RC filtering unit is connected to the first protection unit 220 in series. More specifically, the first protection unit 220 has an anode coupled to the first end of the sixth resistor element R', and a cathode electrically connected to the anode of the diode element D'.

As can be seen from FIG. 3, the electronic switch 10 includes a first resistor element R1, a second resistor element R2, a third resistor element R3, a fourth resistor element R4, a fifth resistor element R5, a first capacitor element C1, and a transistor element Q1. The first resistor element R1 has a first end coupled to the reference power supply VCC and a second end electrically connected to a first end of the second resistor element R2. The third resistor element R3 has a first end coupled to a junction of the second resistor element R2 and the first resistor element R1, and a second end connected to the ground GND.

The fourth resistor element R4 has a first end coupled to the first end of the first resistor element R1, and a second end coupled to a first end of the fifth resistor element R5. Then, a second end of the fifth resistor element R5 is coupled to a first end of the first capacitor element C1 as well as a junction of the cathode of the first protection unit 220 and the anode of the diode element D'. A second end of the first capacitor element C1 is coupled to the ground GND.

The transistor element Q1 has a gate G, a source S, and a drain D. The gate G is coupled to a second end of the second resistor element R2, the drain D is coupled to a junction of the fourth resistor element R4 and the fifth resistor element R5, and the source S is coupled to the second end of the third resistor element R3 and accordingly, connected to the ground GND.

The transistor element Q1 is an N-channel enhancement mode field effect transistor (NMOS transistor) for use as a switch control. In the illustrated preferred embodiment of the present invention, the transistor element Q1 is an NMOS transistor. However, it is understood the transistor element Q1 in the present invention is not necessarily limited to the NMOS transistor, but can be any other transistors, such as a bipolar junction transistor (BJT), a field effect transistor (FET), a metal-oxide-semiconductor field-effect transistor (MOSFET), etc., so long as the transistor can be used as a switch.

The PWM DC steady-state output circuit of the present invention further includes a second protection unit 30, which is a diode for limiting an external high voltage.

For example, when a general input voltage range is from 0V to 12V and the second protection unit 30 has a voltage range from 0V to 15V, the provision of the second protection unit 30 allows the input voltage range to be increased up to 15V. The second protection unit 30 has a first end coupled to a junction of the first resistor element R1, the second resistor element R2, and the third resistor element R3.

The following describes the operation of the present invention when the PWM signal has a low frequency, such as 10 Hz.

Figure 5:
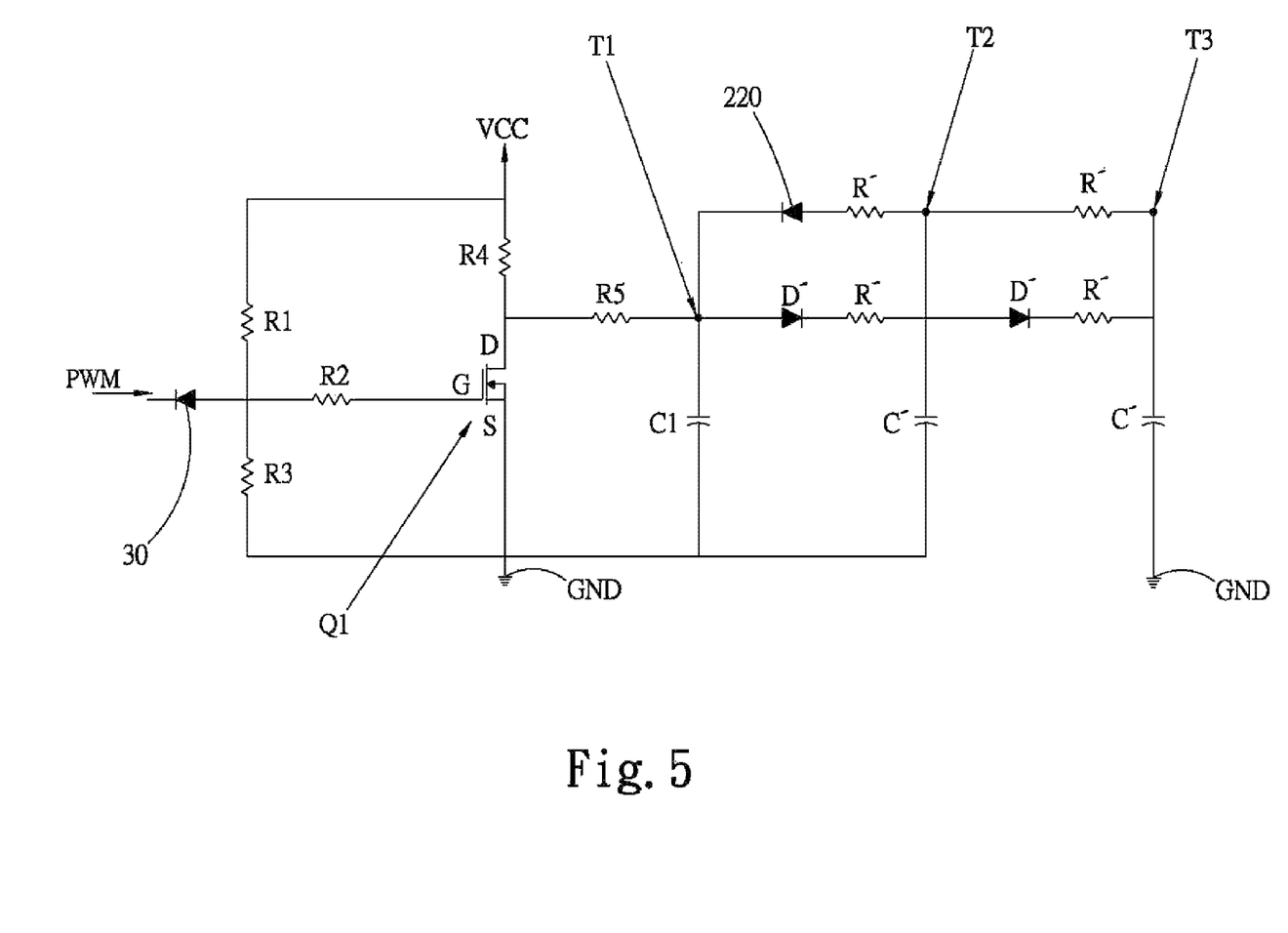
FIG. 5 is a circuit diagram of the PWM DC steady-state output circuit of the present invention with an RC integrating filter having 2-order RC filtering units.
Figure 7A:
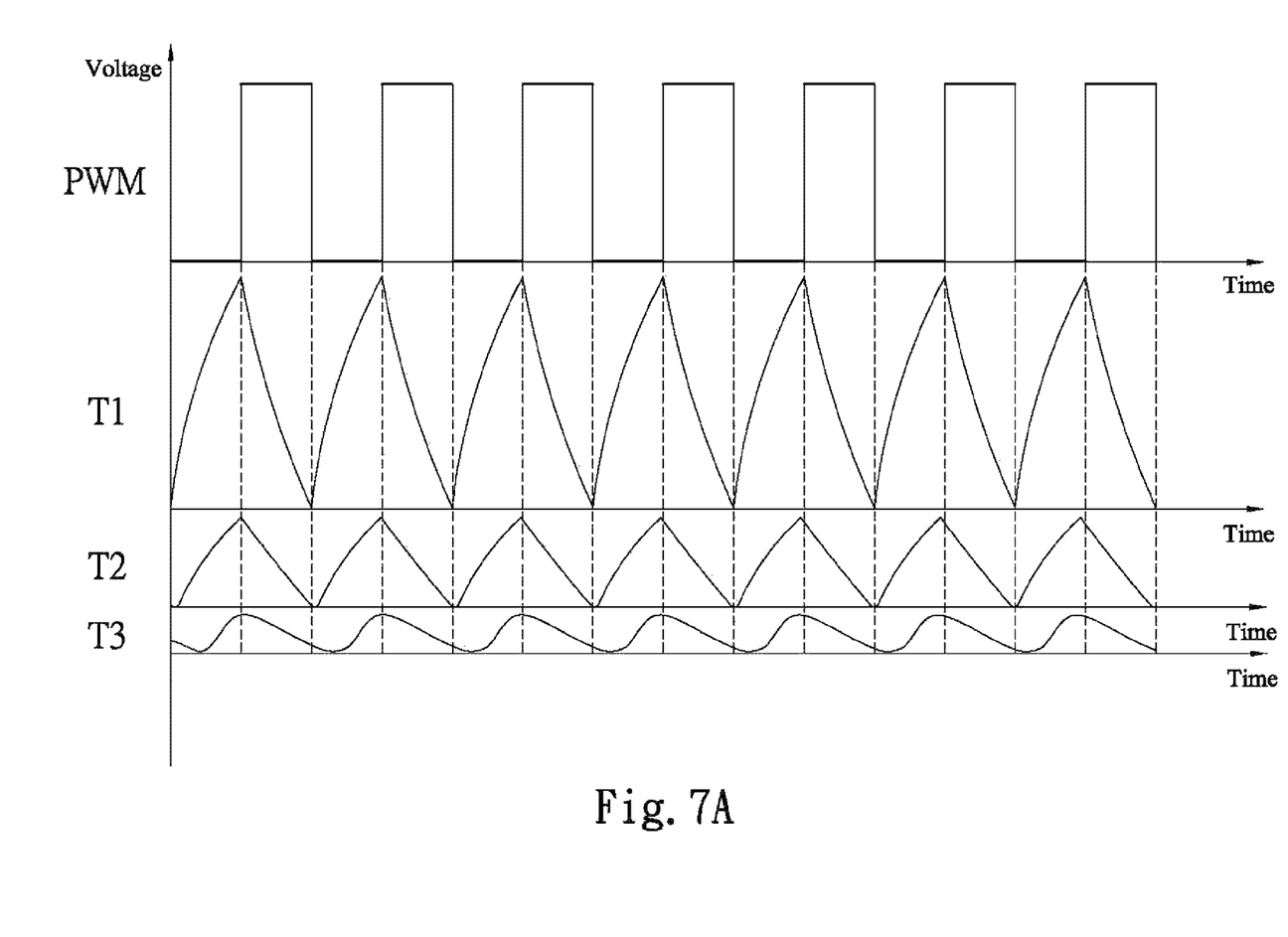
FIG. 7A shows PWM and T1, T2, and T3 waveforms of the present invention.

Please refer to FIGS. 5 and 7A. FIG. 5 is a circuit diagram of the present invention with the RC integrating filter having 2-order RC filtering units. When the PWM signal is input via a second end of the second protection unit 30 and the PWM signal is in the state OFF or at a low level zero (0), the PWM signal is not able to trigger the transistor element Q1. That is, the transistor element Q1 is turned off because a voltage at the gate G is lower than a voltage at the source S. At this point, the transistor element Q1 is cut off, so that the electric current from the reference power supply VCC flows through the fourth resistor element R4 and the fifth resistor element R5, and is then shunted to the first capacitor element C1 as well as the capacitor element C' on each of the first-order and the second-order RC filtering unit until the capacitor elements are saturated, as indicated by the waveforms T1, T2, and T3 in FIG. 7A.

On the other hand, when the PWM signal is in the state ON or at a high level one (1), the PWM signal is able to trigger the transistor element Q1 immediately. That is, the transistor element Q1 is turned on because the voltage at the gate G is higher than the voltage at the source S. At this point, the transistor element Q1 is ON, so that the electric current from the reference power supply VCC sequentially flows through the fourth resistor element R4 as well as the drain D and the source S of the transistor element Q1, and then quickly flows to the ground GND and is consumed. Meanwhile, when the first capacitor element C1 and the capacitor element C' of each of the first-order and the second-order RC filtering unit are in the process of discharge, as indicated by the waveforms T1, T2, and T3 in FIG. 7A, the second-order RC filtering unit will make feedback compensation to the level of the first-order RC filtering unit, so that a steady-state DC level can be output to a control unit (not shown), such as a fan driving IC or a fan MCU, enabling the control unit to accurately determine the fan rotating speed output based on the received steady-state DC level and accordingly, control the fan operation. Therefore, in the case of a low-frequency PWM signal input, the above arrangements effectively enable the fan rotating speed to be output in a steady state, that is, to be output at a steady-state DC level.

Figure 6:
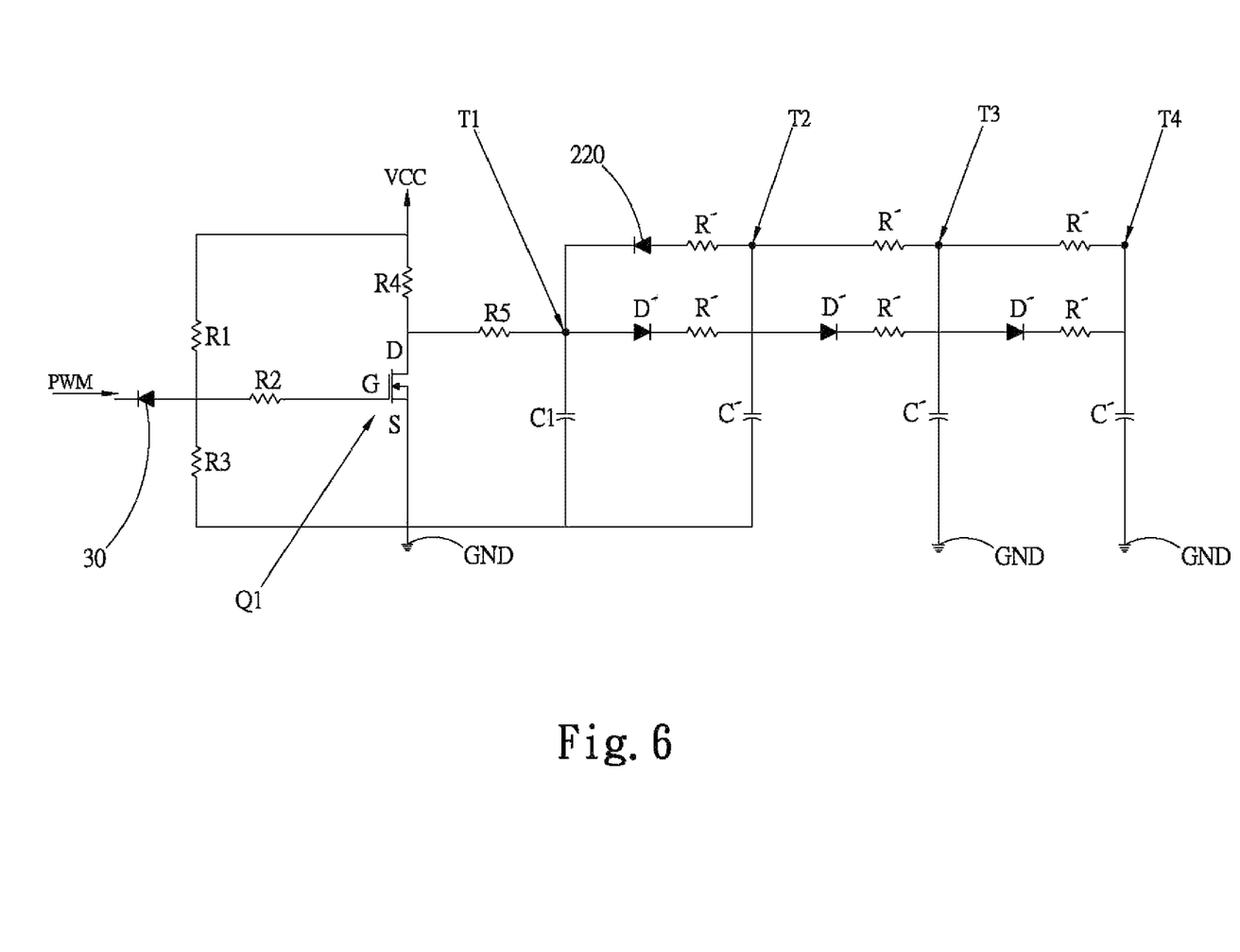
FIG. 6 is a circuit diagram of the PWM DC steady-state output circuit of the present invention with an RC integrating filter having 3-order RC filtering units.
Figure 7B:
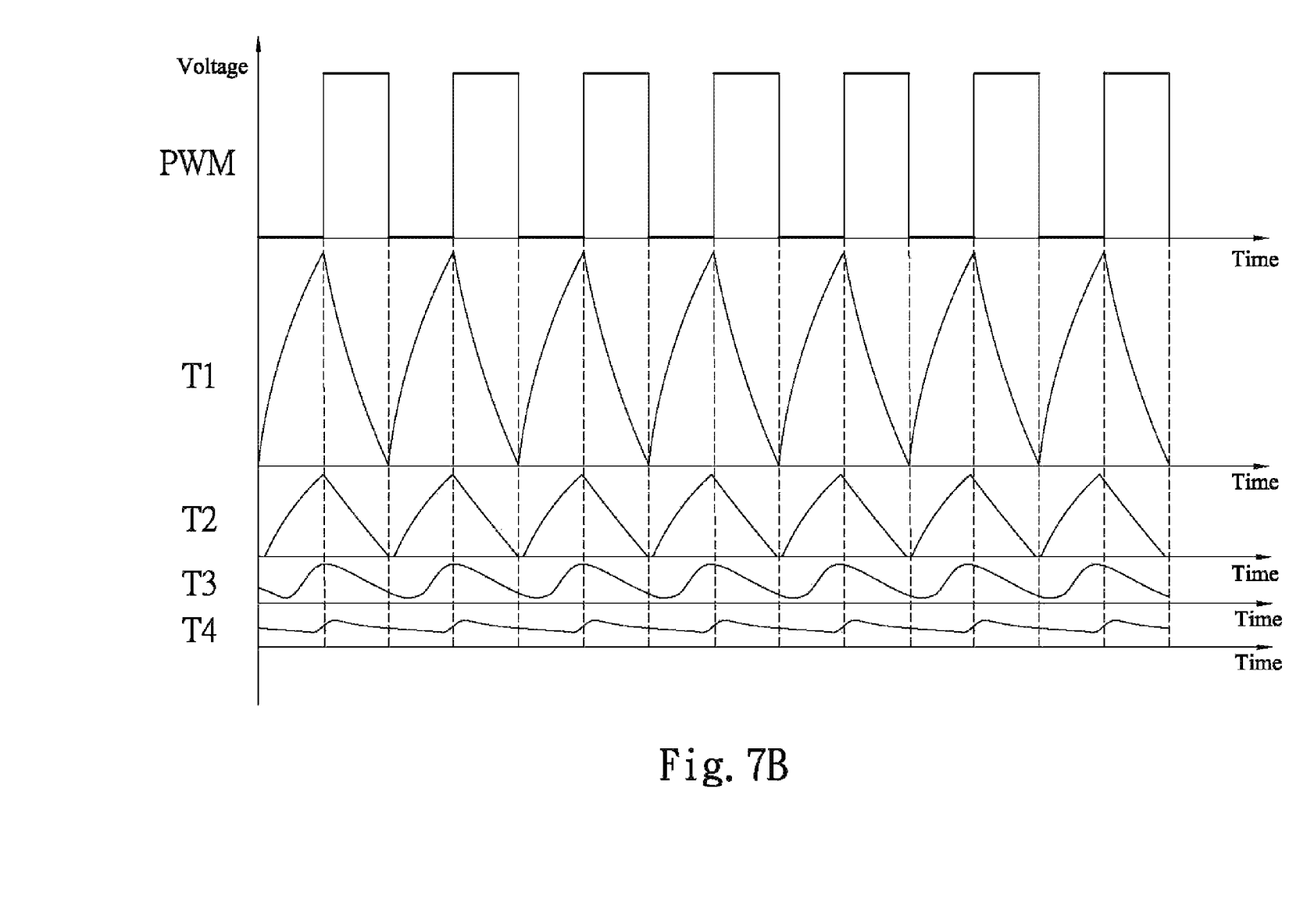
FIG. 7B shows PWM and T1, T2, T3, and T4 waveforms of the present invention

Please refer to FIGS. 6 and 7B. FIG. 6 is a circuit diagram of the present invention with the RC integrating filter having 3-order RC filtering units. When the PWM signal is input via a second end of the second protection unit 30 and the PWM signal is in the state OFF or at a low level zero (0), the PWM signal is not able to trigger the transistor element Q1. That is, the transistor element Q1 is turned off because a voltage at the gate G is lower than a voltage at the source S. At this point, the transistor element Q1 is cut off, so that the electric current from the reference power supply VCC flows through the fourth resistor element R4 and the fifth resistor element R5, and is then shunted to the first capacitor element C1 as well as the capacitor element C' on each of the first-order, the second-order, and the third-order RC filtering unit until the capacitor elements are saturated, as indicated by the waveforms T1, T2, T3, and T4 in FIG. 7B.

On the other hand, when the PWM signal is in the state ON or at a high level one (1), the PWM signal is able to trigger the transistor element Q1 immediately. That is, the transistor element Q1 is turned on because the voltage at the gate G is higher than the voltage at the source S. At this point, the transistor element Q1 is ON, so that the electric current from the reference power supply VCC sequentially flows through the fourth resistor element R4 as well as the drain D and the source S of the transistor element Q1, and then quickly flows to the ground GND and is consumed. Meanwhile, when the first capacitor element C1 and the capacitor element C' of each of the first-order, the second-order, and the third-order RC filtering unit are in the process of discharge, as indicated by the waveforms T1, T2, T3, and T4 in FIG. 7B, the third-order RC filtering unit will make feedback compensation to the level of the second-order RC filtering unit, and the second-order RC filtering unit will make feedback compensation to the level of the first-order RC filtering unit, so that a steady-state DC level can be output to the control unit (not shown), enabling the control unit to accurately determine the fan rotating speed output based on the received steady-state DC level and accordingly, control the fan operation. Therefore, in the case of a low-frequency PWM signal input, the above arrangements effectively enable the fan rotating speed to be output in a steady state, that is, to be output at a steady-state DC level.

From the above description, it is concluded the PWM DC steady-state output circuit of the present invention provides the following advantages: (1) being able to output stable DC level; (2) enabling effective regulation of the circuit by increasing or decreasing the number of orders of the RC filtering units according to actual circuit requirements; and (3) enabling the control unit to accurately acquire steady-state DC level even having a low-frequency PWM input, so that the fan rotating speed output is stable.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A pulse-width-modulation (PWM) direct current (DC) steady-state output circuit, comprising:
   an electronic switch having a signal input end, via which a PWM signal is input, and a high-level end; and
   a resistor-capacitor (RC) integrating filter consisting of at least one RC filtering unit and a first protection unit;
   wherein there can be (1+n) order(s) of RC filtering unit(s) with a first-order RC filtering unit connected to the electronic switch and the first protection unit and the rest n orders of RC filtering units selectively connected to the first-order RC filtering unit; the n orders of RC filtering units are sequentially connected to a preceding order of RC filtering unit one by one; and, when the electronic switch has signals input thereto, the RC filtering unit of the RC integrating filter at each of the orders makes feedback compensation to a level of a preceding order of RC filtering unit, so that a steady-state DC level is output.

2. The PWM DC steady-state output circuit as claimed in claim 1, wherein the RC filtering unit at each of the orders includes a sixth and a seventh resistor element, a capacitor element, and a diode element; the diode element having an anode connected to a first end of the sixth resistor element and a cathode coupled to a first end of the seventh resistor element; the seventh resistor element having a second end connected to a second end of the sixth resistor element and a first end of the capacitor element; and the capacitor element having a second end coupled to a ground.

3. The PWM DC steady-state output circuit as claimed in claim 1, wherein the electronic switch includes:
   a first resistor element having a first end coupled to a reference power supply;
   a second resistor element having a first end coupled to a second end of the first resistor element;
   a third resistor element having a first end coupled to a junction of the first resistor element and the second resistor element, and a second end coupled to the ground;
   a fourth resistor element having a first end coupled to the first end of the first resistor element;
   a fifth resistor element having a first end coupled to a second end of the fourth resistor element;
   a first capacitor element having a first end coupled to a second end of the fifth resistor element, and a second end coupled to the ground; and
   a transistor element having a gate coupled to a second end of the second resistor element, a source coupled to the second end of the third resistor element, and a drain coupled to a junction of the fourth resistor element and the fifth resistor element.

4. The PWM DC steady-state output circuit as claimed in claim 3, further comprising a second protection unit; and the second protection unit having a first end coupled to a junction of the first resistor element, the second resistor element and the third resistor element for limiting an external high voltage.

5. The PWM DC steady-state output circuit as claimed in claim 4, wherein the second protection unit is a diode.

6. The PWM DC steady-state output circuit as claimed in claim 1, wherein the first protection unit is a diode.

7. The PWM DC steady-state output circuit as claimed in claim 1, wherein n can be zero or any positive integer.

8. A PWM DC steady-state output circuit, comprising:
- an electronic switch having a signal input end, via which a PWM signal is input, and a high-level end; and
- an RC integrating filter consisting of at least one RC filtering unit and a first protection unit;
- wherein there can be at least one order of the RC filtering unit(s) with a first-order RC filtering unit connected to the electronic switch and the first protection unit; and, when the electronic switch has signals input thereto, the RC integrating filter makes feedback compensation, so that a steady-state DC level is output; and
- wherein the RC integrating filter further includes additional orders of RC filtering units sequentially connected to the first-order RC filtering unit, and the RC filtering unit at each of the additional orders being connected to a preceding order of RC filtering unit one by one.

9. The PWM DC steady-state output circuit as claimed in claim 8, wherein the first protection unit is a diode.

10. The PWM DC steady-state output circuit as claimed in claim 8, wherein the RC filtering unit at each of the orders includes a sixth and a seventh resistor element, a capacitor element, and a diode element; the diode element having an anode connected to a first end of the sixth resistor element and a cathode coupled to a first end of the seventh resistor element; the seventh resistor element having a second end connected to a second end of the sixth resistor element and a first end of the capacitor element; and the capacitor element having a second end coupled to a ground.

11. The PWM DC steady-state output circuit as claimed in claim 8, wherein the electronic switch includes:
- a first resistor element having a first end coupled to a reference power supply;
- a second resistor element having a first end coupled to a second end of the first resistor element;
- a third resistor element having a first end coupled to a junction of the first resistor element and the second resistor element, and a second end coupled to the ground;
- a fourth resistor element having a first end coupled to the first end of the first resistor element;
- a fifth resistor element having a first end coupled to a second end of the fourth resistor element;
- a first capacitor element having a first end coupled to a second end of the fifth resistor element, and a second end coupled to the ground; and
- a transistor element having a gate coupled to a second end of the second resistor element, a source coupled to the second end of the third resistor element, and a drain coupled to a junction of the fourth resistor element and the fifth resistor element.

12. The PWM DC steady-state output circuit as claimed in claim 11, further comprising a second protection unit; and the second protection unit having a first end coupled to a junction of the first resistor element, the second resistor element and the third resistor element for limiting an external high voltage.

13. The PWM DC steady-state output circuit as claimed in claim 12, wherein the second protection unit is a diode.

* * * * *